United States Patent [19]

Shiralagi et al.

[11] Patent Number: 5,956,568
[45] Date of Patent: Sep. 21, 1999

[54] METHODS OF FABRICATING AND CONTACTING ULTRA-SMALL SEMICONDUCTOR DEVICES

[75] Inventors: Kumar Shiralagi, Chandler; Sung P. Pack, Tempe, both of Ariz.

[73] Assignee: Motorola, Inc., Schaumburg, Ill.

[21] Appl. No.: 08/613,795

[22] Filed: Mar. 1, 1996

[51] Int. Cl.⁶ ................................................. H01L 21/00
[52] U.S. Cl. .................... 438/41; 438/573; 438/604; 438/973; 438/979; 257/14; 257/25; 257/37; 257/623
[58] Field of Search ............................... 438/39, 41, 573, 438/604, 973, 979; 257/12, 14, 25, 37, 623

[56] References Cited

U.S. PATENT DOCUMENTS

| | | | |
|---|---|---|---|
| 5,093,699 | 3/1992 | Weichold et al. | 357/23 |
| 5,554,860 | 9/1996 | Seabaugh | 257/25 |
| 5,659,179 | 8/1997 | Goronkin et al. | 257/25 |

*Primary Examiner*—John Niebling
*Assistant Examiner*—Long Pham
*Attorney, Agent, or Firm*—Eugene A. Parsons

[57] ABSTRACT

A method of fabricating ultra-small semiconductor devices including providing a mesa on a substrate. A plurality of overlying layers of semiconductor material are grown in overlying relationship to the mesa so that a perpendicular discontinuity is produced in the layers at the mesa sidewall and the first layer overlying the mesa is in contact with the last layer overlying the substrate adjacent the mesa. A spacer of nonconductive material is formed on the discontinuity and the plurality of overlying layers are etched, using the spacer as a mask, so as to form a contact area overlying the mesa and a contact area overlying the substrate adjacent the mesa, and a semiconductor device positioned adjacent the sidewall beneath the spacer and between the contact areas.

20 Claims, 3 Drawing Sheets

METHODS OF FABRICATING AND CONTACTING ULTRA-SMALL SEMICONDUCTOR DEVICES

FIELD OF THE INVENTION

The present invention pertains to improved techniques for fabricating ultra-small semiconductor devices.

BACKGROUND OF THE INVENTION

Generally, in the semiconductor industry the most difficulty and/or problems occur with the formation of external electrical connections and with interconnections to different components on a single substrate. Semiconductor devices are typically fabricated on a planar substrate by sequentially growing or depositing several different layers of material and then patterning or etching one or more of the layers to expose a lower surface. Metal is then deposited on the exposed surfaces for interconnections or external connections.

One problem in this process is that the etching requires masking which adds several complicated steps to the process and, consequently, a large amount of labor and cost. Also, the metal contacts require a relatively large amount of real estate and, consequently, many semiconductor devices are limited in size by the ability to provide external connections to them.

A device which solves some of these problems is disclosed in a application entitled "Ultra-Small Semiconductor Devices and Methods of Fabricating and Contacting", Filed Mar. 7, 1995, bearing Ser. No. 08/399,809, and assigned to the same assignee now U.S. Pat. No. 5,659,179. In a specific embodiment, devices of this type are fabricated by providing a supporting substrate with a planar surface and patterning the planar surface of the substrate to form a first pattern edge with a side wall. A layer of material is conformally formed over the substrate surface, including the side wall of the first pattern edge and anisotropically removed so as to leave a selected thickness of the layer of material covering the side wall. The surface of the substrate is etched to form a second pattern edge laterally spaced the selected thickness from the first pattern edge by using the selected thickness of the layer of material covering the side wall as a mask. The selected thickness of the layer of material covering the side wall is then removed and a plurality of overlying layers of material are consecutively formed, at least partially defining a semiconductor device, in overlying relationship to first and second opposite sides of each of the first and second pattern edges so that discontinuities are produced in the layers at each of the first and second pattern edges and a first layer of the plurality of layers on the first opposite side of the first pattern edge is aligned with and in electrical contact with a second layer of the plurality of layers on the second opposite side of the first pattern edge and a third layer of the plurality of layers on the first opposite side of the second pattern edge is aligned with and in electrical contact with a fourth layer of the plurality of layers on the second opposite side of the second pattern edge.

However, these devices still require some additional growth steps which add to the fabrication method.

Accordingly, it would be highly advantageous to provide semiconductor devices and methods of manufacture which do not include additional growth steps for the formation of interconnections and external connections and which utilize conventional lithography.

It is a purpose of the present invention to provide novel methods of fabrication and connection for ultra-small semiconductor devices.

It is another purpose of the present invention to provide novel methods of fabrication and connection of ultra-small semiconductor devices in which at least some of the interconnections are formed automatically during the formation of the various layers.

It is still another purpose of the present invention to provide novel methods of fabrication and connection of ultra-small semiconductor devices in which external terminals and interconnections are formed without requiring additional growth steps.

It is a further purpose of the present invention to provide novel methods of fabricating ultra-small semiconductor devices which are smaller than previously possible with standard external terminals.

It is still a further purpose of the present invention to provide novel simplified methods of fabrication and connection of ultra-small semiconductor devices.

SUMMARY OF THE INVENTION

The above problems are at least partially solved and the above purposes are realized in a method of fabricating ultra-small semiconductor devices including the steps of forming a supporting substrate with a first surface and a second surface joined by a sidewall substantially perpendicular to the first and second surfaces, consecutively forming a plurality of overlying layers of material, cooperating to define a semiconductor device, in overlying relationship to the first and second surfaces and the sidewall so that a discontinuity is produced in the layers at the sidewall and a first layer of the plurality of layers overlying the first surface is aligned with and in electrical contact with a different layer of the plurality of layers overlying the second surface, forming a spacer of nonconductive material on the discontinuity, and etching the plurality of overlying layers of material, using the spacer as an etch mask, so as to form a first contact area overlying the first surface, a second contact area overlying the second surface, and the semiconductor device positioned adjacent the sidewall beneath the spacer and electrically connected to the first and second contact areas.

Thus, electrical interconnections between different layers of the device are automatically formed during fabrication. Contacts are formed on opposite sides of the discontinuity to complete the device.

BRIEF DESCRIPTION OF THE DRAWINGS

Referring to the drawings.

DESCRIPTION OF THE PREFERRED EMBODIMENT

Figure 1:
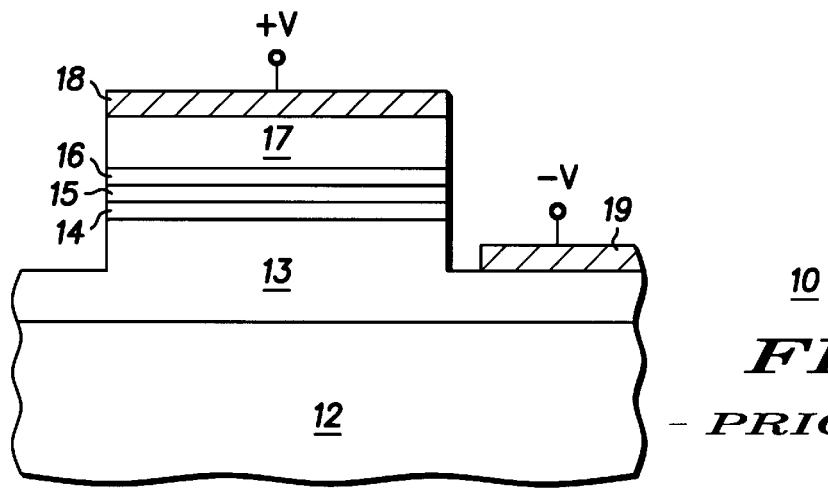
FIG. 1 is a simplified sectional view of a prior art resonant interband tunneling diode.

Referring specifically to FIG. 1, a conventional resonant interband tunneling diode (RITD) 10 is illustrated. Diode 10 is an example of a heterostructure device fabricated on a planar GaAs substrate 12 by the epitaxial growth of sequential layers in the InAs/AlSb/GaSb material system. In the fabrication of diode 10, a first low resistance access layer 13 is epitaxially grown on the planar surface of substrate 12, after which a first barrier layer 14, an active quantum well layer 15, a second barrier layer 16 and a second low resistance access layer 17 are sequentially grown.

A first metal contact 18 is formed on the surface of second access layer 17 by any of the conventional evaporation and patterning techniques. Metal contact 18 is then used as a mask to etch the various layers so as to form the usual mesa configuration which separates the layers into diode 10. A second metal contact 19 is then evaporated onto the surface of a remaining portion of access layer 13 to form a second external terminal for diode 10.

As will be understood by those skilled in the art, several steps are required to pattern metal contact 18 on the surface of access layer 17. Some special etching is required to form the ideally vertical side walls of the mesa without damaging the various layers and reducing the life expectancy of diode 10. For example, the three materials of the diode, InAs, GaSb and AlSb, have different characteristics and etch at different rates in a mesa etch solution. Therefore, the sidewall form cannot be easily controlled. Also, several additional steps are required to pattern metal contact 19 in electrical contact with access layer 13, again without damaging the other exposed layers or producing shorts and the like therebetween. Further, access layer 13 must be grown substantially thicker than the other layers to provide sufficient material for etching deep enough to completely isolate the various layers of diode 10 while retaining a sufficient thickness to carry the current of diode 10 to metal contact 19.

Figure 2:
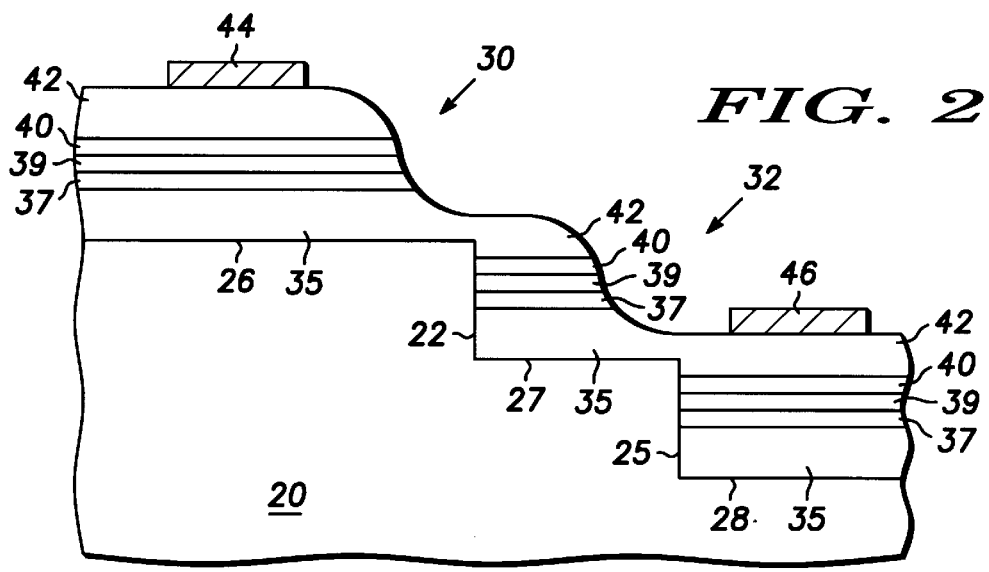
FIG. 2 is a simplified sectional view of a stack of resonant tunneling diodes in accordance with a copending application.

Referring now to FIG. 2, a device which solves some of these problems is illustrated. (This device is disclosed in detail in a copending application entitled "Ultra-Small Semiconductor Devices and Methods of Fabricating and Contacting", Filed Mar. 7, 1995, bearing Ser. No. 08/399, 809, and assigned to the same assignee now U.S. Pat. No. 5,659,179, issued Aug. 19, 1997. A substrate 20 is illustrated with stacked double barrier diodes 30 and 32 formed thereon. A plurality of layers of semiconductor material are sequentially formed on the upper surface of substrate 20 so as to overlie both sides of both pattern edges 22 and 25. In this specific embodiment, the plurality of layers are epitaxially grown to form a first access layer 35 on the surface of substrate 20, a first barrier layer 37 on layer 35, an active quantum well layer 39 on first barrier layer 37, a second barrier layer 40 on active quantum well layer 39 and a second access layer 42 on second barrier layer 40.

Pattern edges 22 and 25 are selected to be no-growth facets. Using the faceted growth behavior at pattern edges 22 and 25, first access layer 35 grown on one side of pattern edge 22 (on surface 26) is aligned with and in electrical contact with second access layer 42 grown on the other side of pattern edge 22 (on surface 27) and first access layer 35 grown on one side of pattern edge 25 (on surface 27) is aligned with and in electrical contact with second access layer 42 grown on the other side of pattern edge 25 (on surface 28).

Diodes 30 and 32 are completed by forming external contacts or terminals thereto. This is accomplished simply by evaporating ohmic metal contacts by the lift-off technique onto the surface of layer 42 in overlying relationship to surfaces 26, 27 and 28 of substrate 20. In this fashion, a first contact 44 is formed on layer 42 on a first side of pattern edge 22, which operates as a first terminal for diodes 30 and 32. Also, a second contact 46 is formed on layer 42 on the opposite side of pattern edge 25 and operates as a second terminal for diode 32. In this embodiment, layers 35, 37, 39 and 40, on the side of pattern edge 25 opposite step surface 27 are not connected and simply fill the groove adjacent pattern edge 25.

A method of fabricating ultra-small semiconductor device is now disclosed referring to FIGS. 3–7, which method is an improvement over the method described above with reference to FIG. 2.

Figure 3:
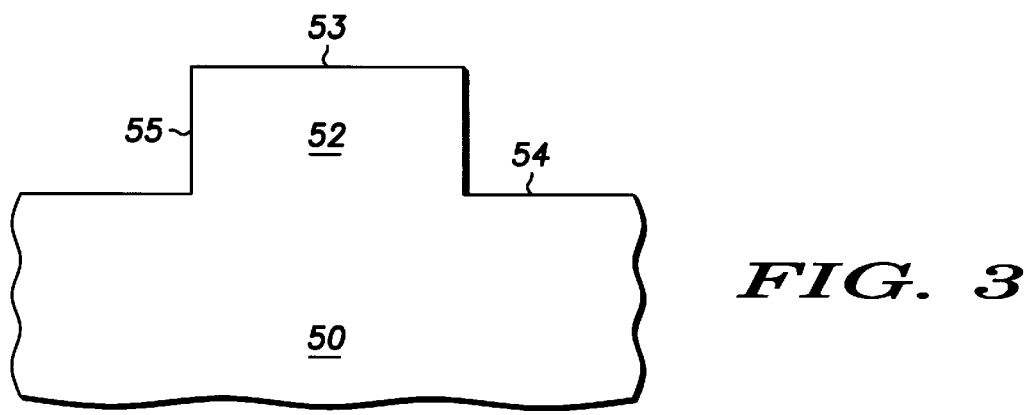
FIGS. 3 through 7 are simplified sectional views of various steps in a method of fabricating an ultra-small semiconductor device in accordance with the present invention.

Referring specifically to FIG. 3, a substrate 50 is illustrated having a mesa 52 formed on the upper surface thereof. Mesa 52 may be formed with any desired cross-section including round, square, rectangular, etc. Also, mesa 52 is formed with an upper surface 53 parallel with a remaining surrounding surface 54 of substrate 50, and a vertical sidewall 55 joining surface 53 and surface 54. Mesa 52 can be formed by etching substrate 50 in any of the well known methods utilized in the semiconductor industry. In an alternative method, mesa 52 can be formed by selectively growing or by patterning the growth of material on the upper surface of substrate 50.

In a specific embodiment, substrate 50 is formed of gallium arsenide (GaAs) and is crystallographically oriented with the {100} surface parallel to the surfaces 53 and 54. It will of course be understood that this structure can be extended to InP and other substrates with semiconductor devices, such as RITDs, in other material systems.

Figure 4:
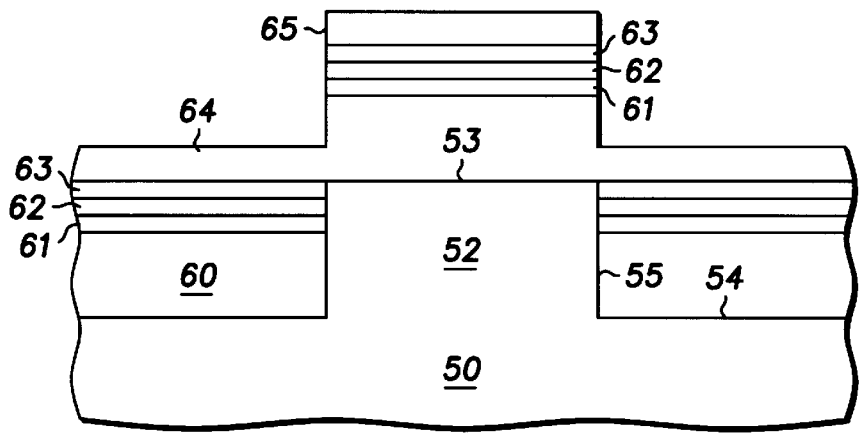

Referring now to FIG. 4, a plurality of overlying layers 60–64 are consecutively grown on substrate 50 overlying mesa 52 so that a discontinuity 65 is produced in layers 60–64 at the sidewall 55. Layers 60–64 are grown at growth conditions optimized to obtain a vertical orientation of discontinuity 65 with lines crystallographically oriented in the <011> direction. Also, the height of mesa 52 is chosen so that layers 60–64 are offset at discontinuity 65 and sidewall 55. Because of the height of mesa 52, the offset is such that layer 60 overlying surface 53 of mesa 52 is at least partially aligned with and in electrical contact with layer 64 overlying surrounding surface 54 of substrate 50. Generally, the height of mesa 52 is selected to be less than a total thickness of the plurality of overlying layers 60–64.

Layers 60 to 64 are chosen so that they cooperate to form a semiconductor device, which in this specific embodiment, is an resonant interband tunneling diode (RITD). Specifically: layer 60 is a first access layer overlying surface 53 of mesa 52 and surrounding surface 54 of substrate 50; Layer 61 is a first barrier layer overlying the first access layer; layer 62 is an active layer overlying the first barrier layer; layer 63 is a second barrier layer overlying the active layer; and layer 64 is a second access layer overlying the second barrier layer. Also, in this specific embodiment layers 60 to 64 are chosen from an indium arsenide (InAs) material system, but it will be understood by those skilled in the art that other material systems might be utilized for other semiconductor devices and in conjunction with other substrates.

Figure 5:
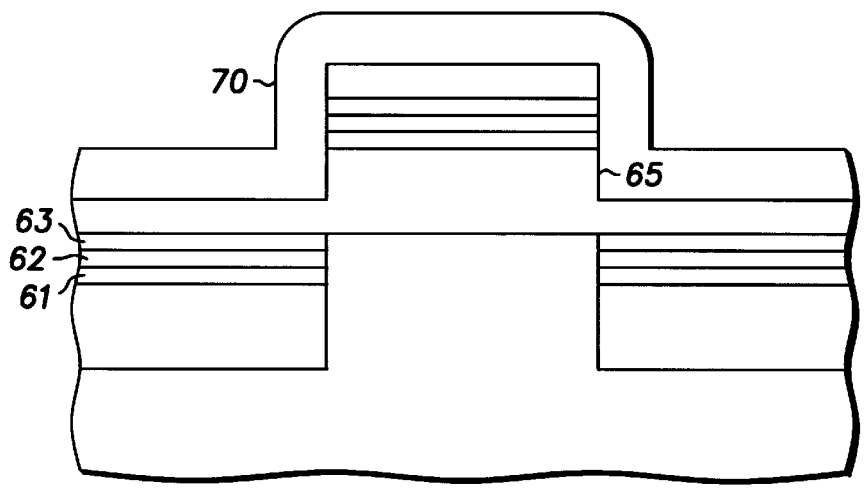

Referring now to FIG. 5, a substantially uniformly thick layer 70 of dielectric material is formed conformally on the surfaces of layer 64 and on discontinuity 65. Layer 70 may be formed of any convenient material that can be easily etched and which will withstand etching of layers 60–64 (as will be described presently). Generally, layer 70 can be any material from a simple photoresist to an oxide or a nitride (such as $Si_3N_4$, $SiO_2$).

Figure 6:
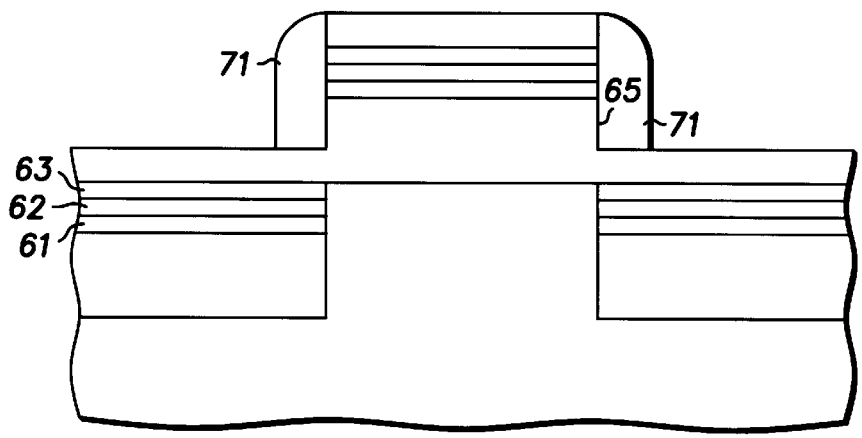

Layer 70 is then anisotropically etched to produce a spacer 71 positioned on discontinuity 65, as illustrated in FIG. 6. Generally, as will be understood by those skilled in the art, the thickness of spacer 71, at the bottom thereof (which is the desired dimension), is controlled by the initial thickness of layer 70. Further, it will be recognized by those skilled in the art that the thickness of layer 70 can be very accurately controlled. Also, the etching process that produces spacer 71 can be very accurately controlled. Thus, the thickness of spacer 71 can be very accurately controlled.

Figure 7:
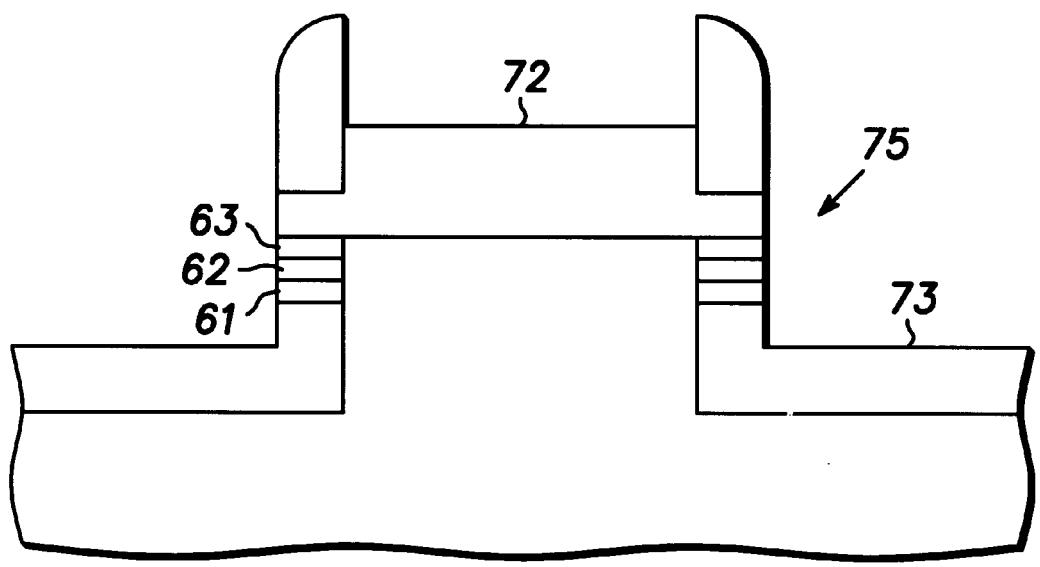

With spacer 71 formed the desired width, a second etch step is performed on layers 60–64, as illustrated in FIG. 7. More specifically, layers 61–64 are etched, using spacer 71 as an etch mask leaving a portion 72 of layer 60 on surface 53 of mesa 52 and a portion 73 of surrounding surface 54 of substrate 50. Because the etch is anisotropic, portions of layers 61–64 remain beneath spacer 71, which portions form an RITD 75. Further, one terminal of RITD 75 is defined by portion 72 of layer 60 overlying surface 53 of mesa 52 and a second terminal of RITD 75 is defined by portion 73 of layer 60 overlying surrounding surface 54 of substrate 50.

RITD 75 is completed by forming external contacts or terminals thereto. This is accomplished simply by evaporating ohmic metal contacts (not shown) by the lift-off technique onto portions 72 and 73 of layer 60. In this fashion, a first contact is formed on portion 72 of layer 60 in electrical contact with a first terminal of RITD and a second contact is formed on portion 73 of layer 60 on the opposite side of discontinuity 65 and operates as a second external contact for RITD 75.

Thus, because spacer 71 can be very accurately formed, RITD can be formed with a width of about 0.1 µm. The present novel method of fabrication enables the fabrication of submicron semiconductor devices with conventional lithography from growth of selected materials on patterned substrates. Further, the external connections can be formed as large as necessary (or as small as desired) by simply adjusting the area of surface 53 of mesa 52 and the surrounding surface 54 of substrate 50. While in the specific embodiment described substrate 50 is formed of gallium arsenide (GaAs) and is crystalographically oriented with the {100} surface parallel to the surfaces 53 and 54, it should be understood that other materials and other orientations might be used. However, it has been found that in the (010) orientation, for example, the grown layers are not vertical and hence are completely disconnected in directions other than the vertical direction.

Accordingly, novel semiconductor devices and methods of manufacture are disclosed which eliminate many patterning and/or growth steps in the formation of the semiconductor devices and interconnections and external connections therefor. Further, novel ultra-small semiconductor devices and methods of fabrication and connection are disclosed in which at least some of the interconnections are formed automatically during the formation of the various layers. Also, novel ultra-small semiconductor devices which are smaller than previously possible with standard external terminals are disclosed.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating ultra-small semiconductor devices comprising the steps of:

forming a supporting substrate with a first surface and a second surface joined by a sidewall substantially perpendicular to the first and second surfaces;

consecutively forming a plurality of overlying layers of semiconductor material, defining a semiconductor device, over the first and second surfaces and the sidewall so that a discontinuity is produced in the layers at the sidewall and a first layer of the plurality of layers overlying the first surface is aligned with and in electrical contact with a different layer of the plurality of layers overlying the second surface;

forming a spacer of nonconductive material on the discontinuity; and etching the plurality of overlying layers of material, using the spacer as an etch mask, so as to form a first contact area overlying the first surface, a second contact area overlying the second surface, and the semiconductor device positioned adjacent the sidewall beneath the spacer and electrically connected to the first and second contact areas.

2. A method of fabricating ultra-small semiconductor devices as claimed in claim 1 wherein the step of forming the supporting substrate includes providing a substrate with a surface and growing a mesa with a selected height on the surface of the substrate, and the sidewall is defined by an edge of the mesa.

3. A method of fabricating ultra-small semiconductor devices as claimed in claim 2 wherein the step of providing the substrate includes providing a <100> oriented gallium arsenide substrate.

4. A method of fabricating ultra-small semiconductor devices as claimed in claim 1 wherein the step of forming the supporting substrate includes providing a substrate with a surface and patterning a mesa with a selected height on the surface of the substrate, and the sidewall is defined by an edge of the mesa.

5. A method of fabricating ultra-small semiconductor devices as claimed in claim 4 wherein the height of the mesa is selected to be less than a total thickness of the plurality of overlying layers.

6. A method of fabricating ultra-small semiconductor devices as claimed in claim 4 wherein the step of forming a supporting substrate includes forming a <100> oriented gallium arsenide substrate.

7. A method of fabricating ultra-small semiconductor devices as claimed in claim 1 wherein the plurality of overlying layers of material are consecutively formed so that the discontinuity produced in the layers at the sidewall is a substantially vertical step.

8. A method of fabricating ultra-small semiconductor devices as claimed in claim 7 wherein the plurality of overlying layers of material include material in an InAs material system and the overlying layers are grown with each layer oriented in the <011> direction.

9. A method of fabricating ultra-small semiconductor devices as claimed in claim 1 and further including the step of forming electrical contacts on an upper surface of the plurality of layers of material on each side of the sidewall so that the electrical contacts define two terminals of the semiconductor device.

10. A method of fabricating ultra-small semiconductor devices as claimed in claim 1 wherein the step of forming a spacer includes conformally forming a layer of material over the plurality of overlying layers of material, including the discontinuity, and anisotropically removing the layer of material so as to leave a selected thickness of the layer of material covering the discontinuity.

11. A method of fabricating ultra-small semiconductor devices as claimed in claim 1 wherein the step of consecutively forming a plurality of overlying layers of material includes forming a first access layer, a first barrier layer on the first access layer, an active layer on the first barrier layer, a second barrier layer on the active layer, and a second access layer on the second barrier layer, and the first access layer overlying the first surface is aligned with and in electrical contact with the second access layer overlying the second surface.

12. A method of fabricating ultra-small semiconductor devices as claimed in claim 1 wherein the step of etching the plurality of overlying layers of material includes etching the plurality of overlying layers of material to a width of approximately 0.1 μm overlying the second surface and adjacent the discontinuity.

13. A method of fabricating ultra-small semiconductor devices comprising the steps of:

forming a supporting substrate with a first surface and a second surface joined by a sidewall substantially perpendicular to the first and second surfaces;

consecutively growing a plurality of overlying layers of semiconductor material over the first and second surfaces and the sidewall so that a discontinuity is produced in the layers at the sidewall, the overlying layers of material including a first access layer, a first barrier layer on the first access layer, an active layer on the first barrier layer, a second barrier layer on the active layer, and a second access layer on the second barrier layer, the discontinuity is formed substantially perpendicular to the first and second surfaces and parallel to the sidewall so that the first access layer of the plurality of layers over the first surface is aligned with and in electrical contact with the second access layer of the plurality of layers over the second surface;

forming a spacer of nonconductive material on the discontinuity; and etching the plurality of overlying layers of material, using the spacer as an etch mask, so as to form a first contact area in the first access layer overlying the first surface, a second contact area in the second access layer overlying the second surface, and the semiconductor device positioned adjacent the sidewall beneath the spacer and electrically connected to the first and second contact areas.

14. A method of fabricating ultra-small semiconductor devices as claimed in claim 13 wherein the step of forming the supporting substrate includes providing a substrate with a surface and growing a mesa with a selected height on the surface of the substrate, and the sidewall is defined by an edge of the mesa.

15. A method of fabricating ultra-small semiconductor devices as claimed in claim 14 wherein the step of providing the substrate includes providing a {100} oriented gallium arsenide substrate.

16. A method of fabricating ultra-small semiconductor devices as claimed in claim 13 wherein the step of forming the supporting substrate includes providing a substrate with a surface and patterning a mesa with a selected height on the surface of the substrate, and the sidewall is defined by an edge of the mesa.

17. A method of fabricating ultra-small semiconductor devices as claimed in claim 16 wherein the height of the mesa is selected to be less than a total thickness of the plurality of overlying layers.

18. A method of fabricating ultra-small semiconductor devices comprising the steps of:

forming a supporting gallium arsenide substrate with a first surface and a second surface oriented in a {100} crystal plane, the first and second surfaces being joined by a sidewall substantially perpendicular to the first and second surfaces;

consecutively growing a plurality of overlying layers of material from an InAs material system over the first and second surfaces and the sidewall with lines oriented in a {011} direction so that a substantially perpendicular discontinuity is produced in the layers parallel to the sidewall and a first layer of the plurality of layers on the first surface is aligned with and in electrical contact with a different layer of the plurality of layers on the second surface, the overlying layers of material defining a semiconductor device;

forming a spacer of nonconductive material on the discontinuity; and etching the plurality of overlying layers of material, using the spacer as an etch mask, so as to form a first contact area overlying the first surface, a second contact area overlying the second surface, and the semiconductor device positioned adjacent the sidewall beneath the spacer and electrically connected to the first and second contact areas.

19. A method of fabricating ultra-small semiconductor devices as claimed in claim 18 wherein the step of forming the supporting substrate includes providing a substrate with a surface and growing a mesa with a selected height on the surface of the substrate, and the sidewall is defined by an edge of the mesa.

20. A method of fabricating ultra-small semiconductor devices as claimed in claim 18 wherein the step of forming the supporting substrate includes providing a substrate with a surface and patterning a mesa with a selected height on the surface of the substrate, and the sidewall is defined by an edge of the mesa.

* * * * *